(12) United States Patent
Lui et al.

(10) Patent No.: US 7,755,379 B2
(45) Date of Patent: *Jul. 13, 2010

(54) CONFIGURATIONS AND METHOD FOR CARRYING OUT WAFER LEVEL UNCLAMPED INDUCTIVE SWITCHING (UIS) TESTS

(75) Inventors: Sik K Lui, Sunnyvale, CA (US); Anup Bhalla, Santa Clara, CA (US)

(73) Assignee: Alpha & Omega Semiconductor, Ltd (BM)

( * ) Notice: Subject to any disclaimer, the term of this patent is extended or adjusted under 35 U.S.C. 154(b) by 100 days.

This patent is subject to a terminal disclaimer.

(21) Appl. No.: 12/082,059

(22) Filed: Apr. 8, 2008

(65) Prior Publication Data

US 2008/0186048 A1    Aug. 7, 2008

Related U.S. Application Data

(63) Continuation of application No. 11/300,082, filed on Dec. 14, 2005, now Pat. No. 7,355,433.

(51) Int. Cl.
*G01R 31/26* (2006.01)
(52) U.S. Cl. .................. 324/768; 324/769
(58) Field of Classification Search ............ 324/110, 324/750–769
See application file for complete search history.

(56) References Cited

U.S. PATENT DOCUMENTS 7,193,410 B2 *   3/2007   Patel et al. ............ 324/158.1
7,355,433 B2 *   4/2008   Lui et al. .................. 324/769

* cited by examiner

*Primary Examiner*—Minh N Tang
(74) *Attorney, Agent, or Firm*—Bo-In Lin

(57) ABSTRACT

This invention discloses a circuit for performing an unclamped inductive test on a metal oxide semiconductor field effect transistor (MOSFET) device driven by a gate driver. The circuit includes a current sense circuit for measuring an unclamped inductive testing (UIS) current that increases with an increase of a pulse width inputted from the gate driver to the MOSFET device wherein the current sensing circuit is provided to turn off the gate driver when a predefined UIS current is reached. The test circuit further includes a MOSFET failure detection circuit connected to a drain terminal of the MOSFET device for measuring a drain voltage change for detecting the MOSFET failure during the UIS test. The test circuit further includes a first switch for switching ON/OFF a power supply to the MOSFET device to and a second switch connected between a drain and source terminal of the MOSFET. Furthermore, the test circuit further includes a timing and make before break (MBB) circuit for receiving an MOSFET failure signal from the MOSFET failure detection circuit and for controlling the first and second switches for switching off a power supply to the MOSFET device upon a detection of an UIS failure under the UIS test to prevent damages to a probe.

2 Claims, 5 Drawing Sheets

Fig. 5B-1 Gate control

Fig. 5B-2 Drain current

Fig. 5B-3 Drain voltage

Fig. 5B-4 Sense control

CONFIGURATIONS AND METHOD FOR CARRYING OUT WAFER LEVEL UNCLAMPED INDUCTIVE SWITCHING (UIS) TESTS

The patent application is a Continuation Prosecution Application (CPA) of patent application Ser. No. 11/300,082, now U.S. Pat. No. 7,355,433, filed on Dec. 14, 2005 by the same inventors of this patent application.

BACKGROUND OF THE INVENTION

1. Field of the Invention

The invention disclosed herein relates generally to testing processes and measurements of device parameters of power semiconductor device. More particularly, this invention relates to a new and more accurate measurement configuration and process to more conveniently obtain accurate device parameters on the wafer level of a semiconductor device.

2. Description of the Relevant Art

The technologies of applying power MOSFET transistors to switch the inductive load are still confronted with technical difficulties and limitations. Specifically, conventional test configurations and processes of measurement are still limited by the difficulties that an unclamped inductive switching (UIS) current cannot be conveniently and accurately set during the UIS test processes of a MOSFET power transistor. The difficulties are especially pronounced when an UIS test is carried out in the wafer level where probe card and cables introduce parasitic inductance thus causes measurement deviations to the UIS current.

During an unclamped inductive switching (UIS) operation, the drain to source junction of the power MOSFET transistor is forced into an avalanche breakdown during the off period of the switching cycles. If the MOSFET device is not properly designed, the power MOSFET may be destroyed by a voltage snap back during the avalanche breakdown. Due to this concern, the capability of a MOSFET to carry out repetitive unclamped inductive switching (UIS) becomes an important performance parameter of the MOSFET power transistors when these transistors are designed for switch applications. In order to assure the quality and reliability of the power MOSFET, it is necessary to carry out repetitive tests of a power MOSFET transistor.

Referring to FIG. 1 for a typical operation for carrying out an UIS testing of a power MOSFET. The test begins with a step of first turning on the MOSFET transistor 10 until the current, as that represented by the symbol I, in the inductor 20 reaches a predetermined value. Then the MOSFET transistor 10 is turned off and forced into an avalanche breakdown. Using a power supply 15 connected to the gate of the power MOSFET 10, such cycles are repeated again until the MOSFET transistor 10 is destroyed and the number of cycles is recorded.

When a MOSFET power transistor fails under the unclamped inductive switching test, all the terminals of the MOSFET transistor 10 are short circuited together. The failure of the MOSFET transistor is detected by detecting a short circuit condition. However, as will be further discussed below, in the wafer level UIS testing processes, the detection of MOSFET failure requires an accurate measurement of the UIS current. The UIS current, i.e., I, is set by turning on the MOSFET 10 for a specific period of time depending on the inductor value as defined by $I=(V/L)*\Delta t$, where V is the power supply voltage 30, L is the inductance of the inductor 20 and $\Delta t$ is the pulse-width of the gate drive to the MOSFET 10. As shown in the equation, any uncertainty the inductance (L) or power supply voltage will cause uncertainty in the current (I).

Typical processes of conducting an UIS testing of a package power MOSFET transistor is usually performed by inserting the transistor in a socket connected to a circuit similar to FIG. 1. The socket is an integral part of the circuit, so the inductance of the circuit is well defined. The UIS current is typical set by adjusting the pulse width of the gate signal to the MOSFET using the equation:

$$I=(V/L)*\Delta t \qquad (1)$$

FIG. 2 illustrates the typical condition of a wafer-level UIS testing. The terminals of the power MOSFET 10 are connected using probes and cables. The probes and cables add parasitic inductance 40 to the circuit. This parasitic inductance 40 changes with probe configuration and cable length and position. Setting the UIS current by simply adjusting a fixed pulse width of the gate drive to the MOSFET transistor becomes inaccurate and unreliable. For these reasons, in order to carry out accurate UIS tests, there is a need to accurately set the UIS current in the wafer level UIS testing.

Therefore, a need still exists in the art to provide an improved device design and test configurations and methods to overcome the above discussed limitations and difficulties.

SUMMARY OF THE PRESENT INVENTION

It is therefore an aspect of the present invention to provide an improved circuit and method to carry out the UIS tests on MOSFET devices with accurately measurable UIS current such that the inaccuracies caused by the parasitic inductance can be removed and the difficulties of the conventional technologies can be resolved.

Moreover, it is an aspect of the present invention to provide an improved circuit and method to switch off the power supply to the MOSFET under test upon the detection of an UIS failure of the MOSFET device such that the maximum current during an UIS failure is limited. Damages to the test probes can be prevented with the controllable switches.

Briefly in a preferred embodiment this invention discloses a circuit for performing an unclamped inductive test on a metal oxide semiconductor field effect transistor (MOSFET) device driven by a gate driver. The circuit includes a current sense circuit for measuring an unclamped inductive testing (UIS) current that increases with an increase of a pulse width inputted from the gate driver to the MOSFET device wherein the current sensing circuit is provided to turn off the gate driver when a predefined UIS current is reached. The test circuit further includes a MOSFET failure detection circuit connected to a drain terminal of the MOSFET device for measuring a drain voltage change for detecting the MOSFET failure during the UIS test. The test circuit further includes a first switch for switching ON/OFF a power supply to the MOSFET device to and a second switch connected between a drain and source terminal of the MOSFET. Furthermore, the test circuit further includes a timing and make before break (MBB) circuit for receiving an MOSFET failure signal from the MOSFET failure detection circuit and for controlling the first and second switches for switching off a power supply to the MOSFET device upon a detection of an UIS failure under the UIS test to prevent damages to a probe.

In another preferred embodiment, the present invention further discloses an array of test circuits comprising at least a first and second test circuits wherein each test circuit is for performing an unclamped inductive test on a first and a second metal oxide semiconductor field effect transistor (MOS- FET) devices. Each of the test circuit further includes a controllable switch for switching OFF a power supply to the first or second MOSFET devices upon detection of a MOSFET failure under the UIS test for limiting a current passing through the first or second MOSFET devices during the MOSFET failure to an UIS current to prevent damages to an UIS testing probe. Each of the test circuits further includes a gate driver for driving the MOSFET with an electric pulse of a controllable pulse width. Each of the test circuits further includes a current sense circuit for measuring an unclamped inductive testing (UIS) current that increases with an increase of the pulse width wherein the current sensing circuit is provided to turn off the gate driver when a predefined UIS current is reached. In a preferred embodiment, the test circuits further include a MOSFET failure detection circuit connected to a drain terminal of the MOSFET device for measuring a drain voltage change for detecting the MOSFET failure during the UIS test. In a preferred embodiment, the test circuits further include a timing and make before break (MBB) circuit connected to the controllable switch for switching off a power supply to the MOSFET device upon a detection of an UIS failure under the UIS test to prevent damages to a probe.

The present invention further discloses a method for performing an unclamped inductive test on a metal oxide semiconductor field effect transistor (MOSFET) device driven by a gate driver. The method includes a step of measuring an unclamped inductive testing (UIS) current by using a current sense circuit while increasing the UIS current by continuously applying a gate driving pulse from the gate driver to the MOSFET device. The method further includes a step of turning off the gate driver when the current sensing circuit measures a predefined UIS current. In a preferred embodiment, the method further includes a step of controlling a first switch for switching OFF a power supply to the MOSFET device and controlling a second switch to switch ON a connection between a drain and source terminal of the MOSFET upon a detection of a MOSFET failure under the UIS test to prevent damages to a test probe. In another preferred embodiment, the method further includes a step of measuring a drain voltage change for detecting a MOSFET failure during the UIS test. In another preferred embodiment, the method further includes a step of controlling and switching off a power supply to the MOSFET device upon a detection of an UIS failure under the UIS test to prevent damages to a probe.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 3:
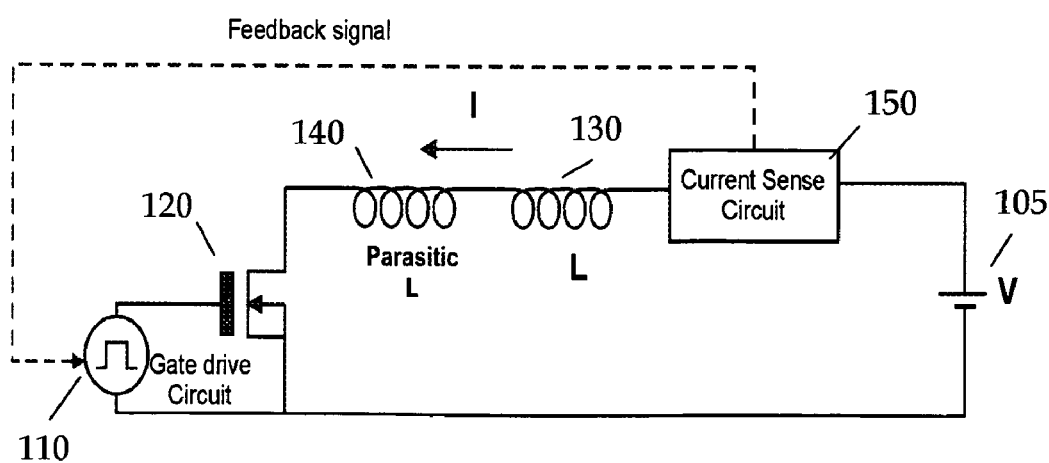
FIG. 3 is a circuit diagram for showing a circuit configuration that includes current sensing circuit of this invention implemented to set the UIS MOSFET current for conducting the UIS MOSFET tests.

Referring to FIG. 3 for a circuit diagram for describing the operation to set the unclamped inductive switching (UIS) current. The process begins with an application of an ON gate signal from a gate drive circuit 110 to the gate of a power MOSFET 120. The current starts to flow through the inductor (L) 130 and the parasitic inductor 140. A current sense circuit 150 monitors the current flowing through the inductors. When the current reaches the desired value, a signal fed back to the gate drive circuit to turn off the gate drive signal. In this approach, the UIS current can be set independent of the inductance value of the inductor and the power supple voltage. The circuit will adjust the ON pulse width inputted from the gate drive circuit 110 to the power MOSFET 120 every cycle to achieve the desired UIS current.

When the power MOSFET 120 fails during UIS testing, the drain terminal becomes a short circuit to source terminal. This short circuit causes a large current to flow from the power supply 105 to the short circuit. Failure detection can be achieved by monitoring the power supply current. However, this large current after UIS failure could damage the probe tip in wafer leveling UIS testing. A new method to detect UIS failure and limit the short circuit current is needed to prevent damage to the probe during wafer level UIS testing.

Figure 4:
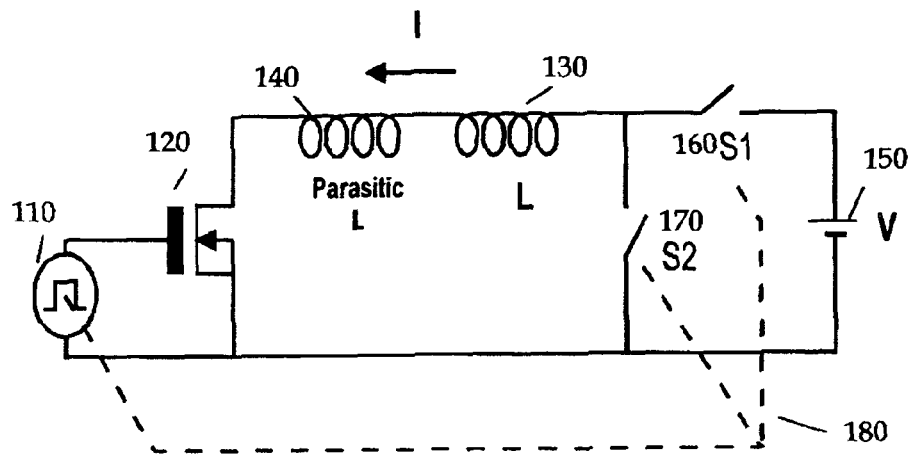
FIG. 4 is a circuit diagram for showing a circuit configuration that includes timing control circuit and switches of this invention implemented to limit the UIS current during a MOSFET failure for conducting the UIS MOSFET tests.

Referring to FIG. 4 for a new method to limit the current flow as an UIS failure occurs. In addition to the current sensing circuit 150 as shown in FIG. 3, two switches 160 and 170, e.g., S1 and S2, are connected to the circuit as shown. Additionally, a timing and make before break circuit 180 is connected between the gate driver circuit 110 and the first and second switches 160 and 170 to synchronize the switches to different operational conditions of the gate driver circuit 110. The timing and MBB circuit 180 controls the first switch 160, e.g., S1, to turn on at the same time when the gate drive is turned on so that the power supply can provide current to the inductors. The timing and MBB circuit 180 further controls the first switch 160, e.g., S1, to turn off when the gate drive is turned off. In the meantime, the timing and MBB circuit 180 controls the second switch 170, e.g., S2, to turn off when the first switch 160, i.e., S1, is turned on. And, conversely, the timing and MBB circuit controls 180 the second switch 170, e.g., S2, to turn on when the first switch 160, e.g., S1, is turn off. During an avalanching of the power MOSFET transistor 120, the first switch 160, i.e., S1, is in the OFF position and the second switch 170, i.e., S2, is at an ON position. Under the circumstances that the power MOSFET 120 fails and becomes a short circuit, since the first switch 160 is turned off and the connection to the power supply 105 is turned off, all the devices in the circuit are disconnected from the power supply 105. Also, there is no gate drive applied to the transistor 120. Therefore, the maximum current that flows through the probe and all the circuit elements is limited to the preset UIS current value. In order to assure the control of the timings of switching ON and Off are synchronized with the gate drive circuit 110, a make-before-break circuit is also implemented in order avoid shorting the power supply through the first and second switches 160 and 170. As the MBB circuit is known to a person of ordinary skill in the art and is commonly implemented in the standard PWM (pulse width modulation) controller as the MOSFET gate driver, no further details of the MBB circuit structure and functional and operational features will be described.

Figure 5A:
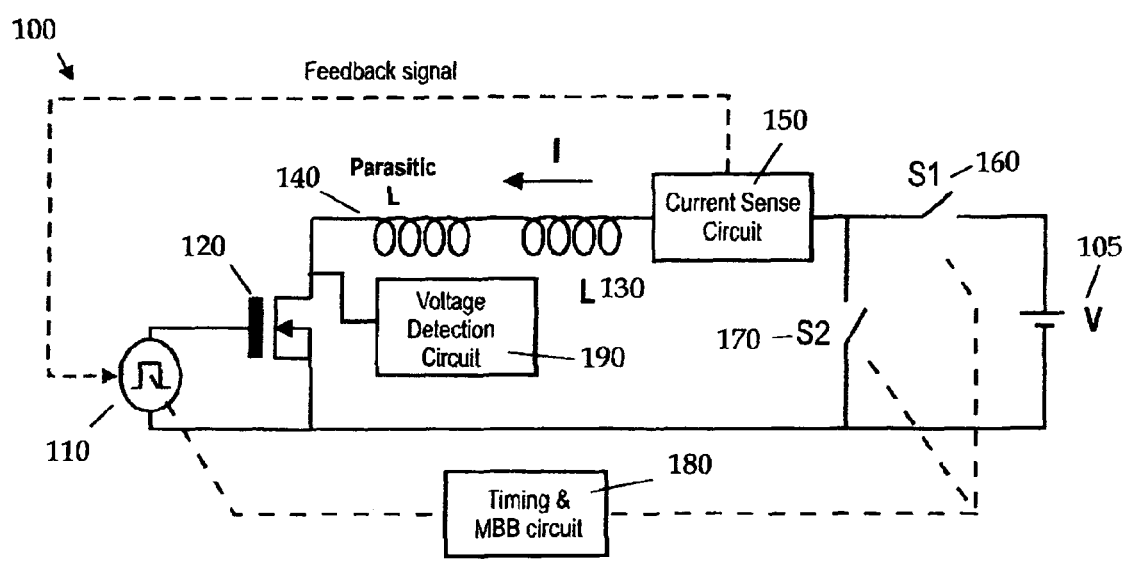
FIG. 5A is a circuit diagram for showing a circuit configuration that includes voltage detection circuit of this invention connected to the drain terminal of the MOSFET device for conducting the UIS MOSFET tests.

With the testing circuit now implemented as that shown in FIG. 4, a new failure detection method is needed since large current flow from the power supply must be eliminated from test circuit. Referring to FIG. 5A, the UIS test system 100 further includes a voltage detection circuit 190 that is connected to the drain terminal of the MOSFET transistor 120 for detecting a transistor failure. Specifically, the transistor failure is detected by monitoring the drain voltage during avalanching breakdown of the MOSFET transistor 120. The voltage at the drain during avalanche breakdown is much higher than the voltage at the drain after the transistor has failed (short circuit). A simple voltage level detection by implementing a voltage detection circuit 190 connected to the drain of the MOSFET 120 is used to detect the failure of the transistor. A failure is detected when the increase of the drain voltage fails to present at the time when the gate drive circuit 110 and the first switch 160 are turned off while the second switch 170 is turned on.

Figure 1:
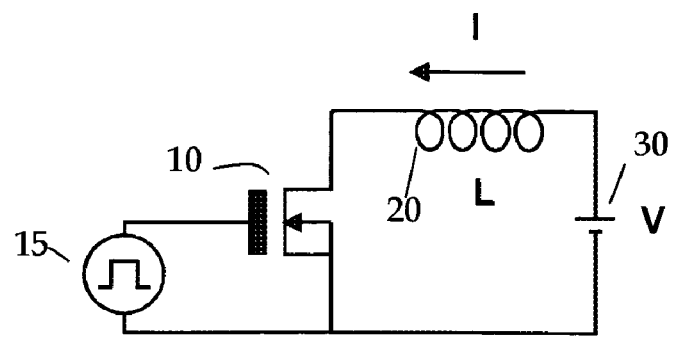
FIG. 1 is a circuit diagram for showing a typical operation for carrying out an UIS testing of a power MOSFET according to conventional technologies.
Figure 2:
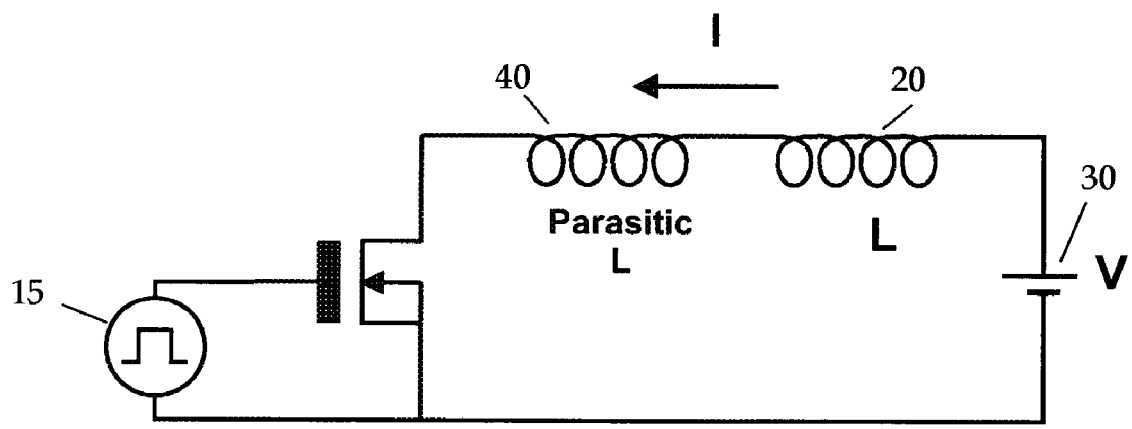
FIG. 2 is a circuit diagram for showing an equivalent circuit with parasitic inductance in a typical operation for carrying out an UIS testing of a power MOSFET according to conventional technologies.
Figure 5B:
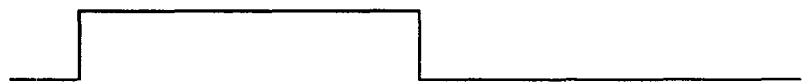
FIG. 5B shows several voltage and current timing diagrams during the UIS test cycle.
Figure 5B:
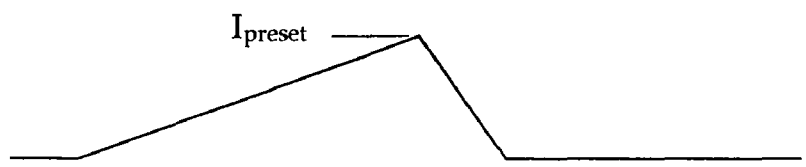
Figure 5B:
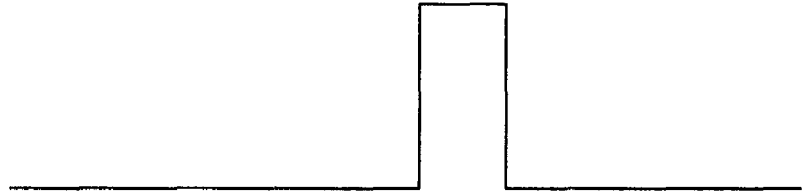
Figure 5B:

FIG. 5B shows the voltage and current changes during an UIS test cycle performed by employing the UIS test system 100 as that shown in FIG. 5A. In FIG. 5B-1, as the gate control voltage pulse from the gate driver circuit 110 is provided to the gate of the MOSFET 120 the drain current begins to increase as shown in FIG. 5B-2. As soon as the drain current reaches the preset UIS current I-preset, a current sensing circuit 150 triggers a signal to turn off MOSFET gate as well as a MBB circuit as shown in FIG. 5A to turn off S1 and turn on S2. The unclamped inductive switch operation causes the MOSFET 120 to enter into a forced avalanche breakdown and the source drain current is dropped down as that shown in FIG. 5B-2. The voltage at the drain during avalanche breakdown jumps up to a higher level as shown in FIG. 5B-3. A sense control signal as that shown in FIG. 5B-4 is sent from the Timing & MBB Circuit 180 to the Voltage Detection Circuit 190 to open the time window for this high voltage detection. Failure of MOSFET 120 during avalanche process causes drain and source short circuit and leads to the absence of this high voltage at the drain. The gate drive circuit 110 and the first switch 160 are turned off while the second switch 170 is turned on to avoid excessive current flow from the power supply.

Figure 5C:
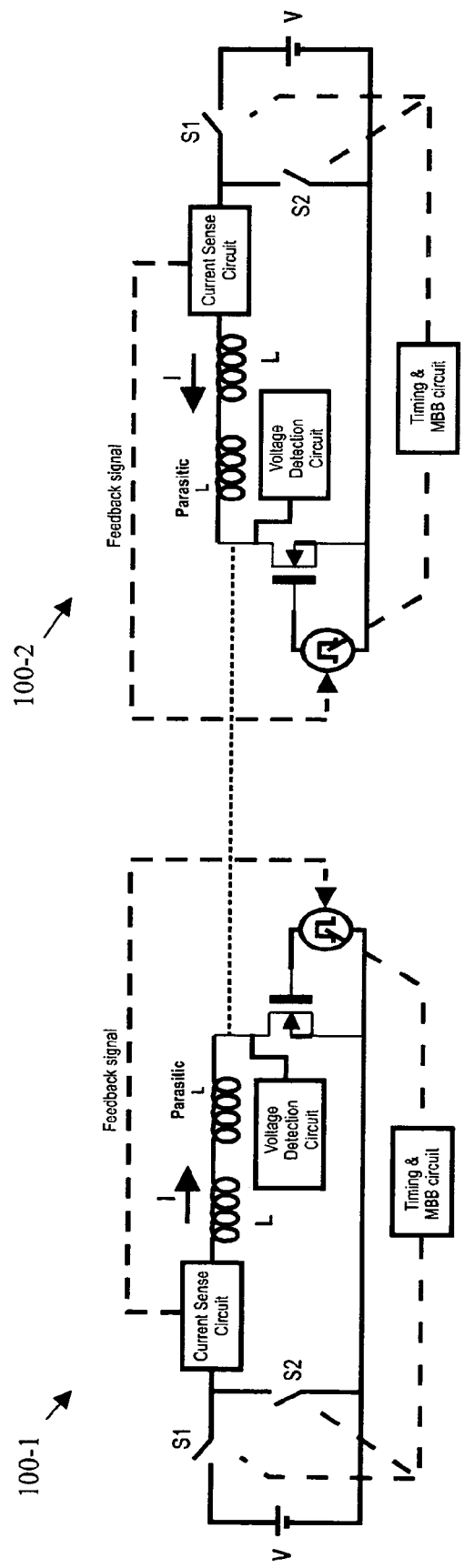
FIG. 5C shows a circuit diagram for an UIS test array provided to simultaneously carry out wafer level UIS tests in parallel on multiple MOSFET chips.

It is desirable to test several devices at the wafer level in parallel. However, since the drain terminals of all the MOSFET devices are connected together on the same substrate, new test configuration must be implemented. The new test configuration must be able to overcome the technical difficulties that it is not practical to short the source terminals of all the devices as that will force the entire avalanche current into a MOSFET device that has the lowest breakdown voltage. In order to allow each MOSFET device to reach its own breakdown voltage, a configuration to carry out parallel UIS testing must be implemented to allow a floating power supply connected to each device such that the gate and source terminals of each device under test can achieve independent voltage levels. To carry out parallel multiple-device UIS tests, such testing circuit must be separately applied to each device in parallel as a test array. In this manner, devices on the same wafer with different breakdown voltages can be UIS tested simultaneously at the wafer level. FIG. 5C is an example of two parallel UIS test systems 100-1 and 100-2 each of these test systems is identically configured as the UIS test system 100 shown in FIG. 5A. These two UIS test systems 100-1 and 100-2 are implemented with a common drain terminal shown with the dotted line 195 to simultaneously carry out the UIS tests in parallel thus greatly increase the speed and performance of test with significantly reduced costs of tests.

Figure 6:
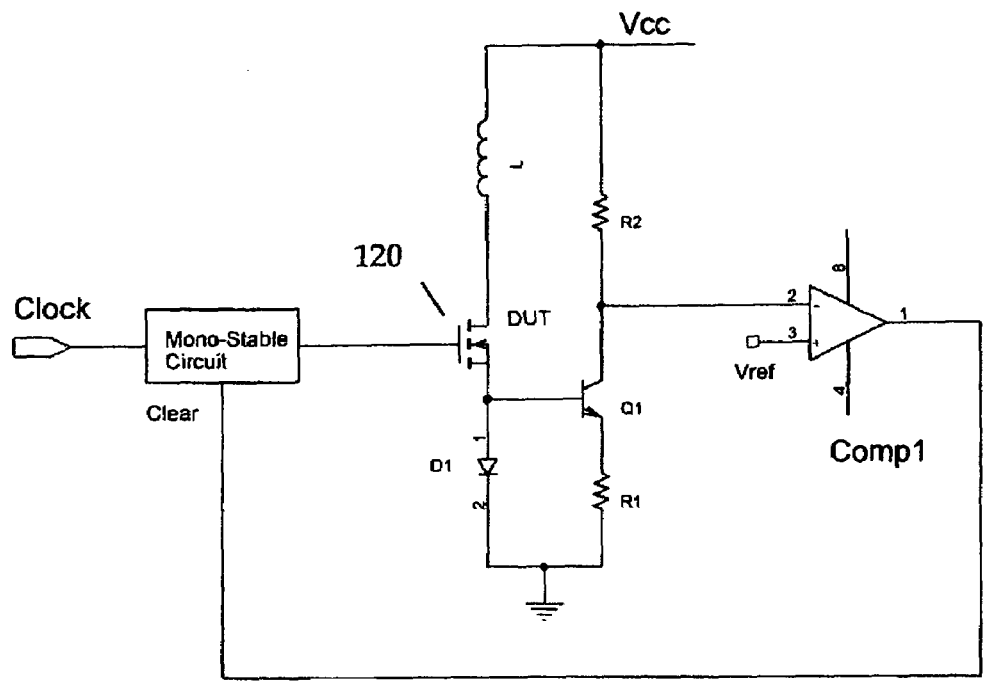
FIG. 6 is a circuit diagram for showing a circuit implementation to set the UIS current for carrying out the MOSFET UIS tests.

Referring to FIG. 6 for an exemplary circuit for setting the UIS current of the power MOSFET where a make before break (MBB) circuit is not explicitly shown for the sake of brevity. In this exemplary circuit, the diode D1, the bipolar transistor Q1 and resistor R1 form the current sense circuitry. The diode D1 is connected in series to the source of the power MOSFET 120. In this configuration, the current of the MOSFET 120 will flow through the diode D1. The voltage appear across D1 will be shared between the Vbe of the bipolar transistor and the resistor R1. So the current through R1 becomes a small percent the actual current through the power MOSFET 120. The voltage drop across resistor R2 is also proportional to this current. The voltage drop is compared with a reference voltage Vref by comparator Comp1.

The clock pulse initiates the mono-stable circuit (one-shot) to switch the output to high and turn on the power MOSFET 120. The current through the MOSFET is increasing at the rate of $V/L_{Total}$ where $L_{Total}$ is the sum of the inductance of 130 and parasitic inductance 140. By the proper choice of R1, R2 and Vref, the comparator Comp1 will switch when a preset current is reached. The output of the comparator is used to clear mono-stable circuit.

Figure 7:
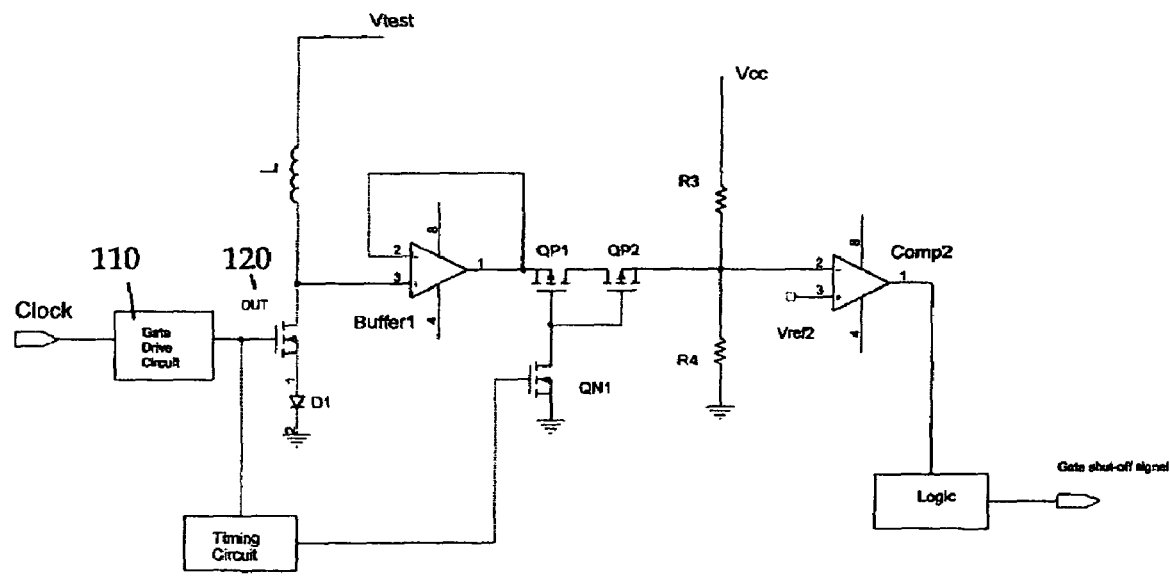
FIG. 7 is a circuit diagram for showing a circuit implementation to detect a MOSFET failure in carrying out the MOSFET UIS tests.

After UIS failure, the drain of the power MOSFET 120 is shorted to the source. Avalanche breakdown will not occur. The drain voltage will be at a low potential during the next test cycle. As discussed above, the failure detection can be achieved by sensing the drain voltage during the avalanche breakdown of the drain. FIG. 7 shows a circuit to detect UIS failure again without explicitly showing the MBB circuit for the sake of brevity. The voltage level detect circuit consists of the buffer amplifier. Buffer1, transistors QN1, QP1, & QP2, resistor R3, R4 and comparator Comp2. One input of the comparator Comp2 is connected to the drain of the power MOSFET 120 as device under test (DUT) through the pass transistor QP1, QP2 and the buffer amplifier Buffer1. The other input of the comparator Comp2 is connected to a reference voltage Vref2. The drain voltage of the power MOSFET 120 is sampled only when QP1 and QP2 are turned on. When QP1 and QP2 are off, the input to the comparator Comp2 is set by the resistor R3 and R4 to a value higher than Vref2. The timing circuit turns on the two p-channel pass transistors for a specific period of time after the gate of the power MOSFET is turned off. The buffer amplifier Buffer1 buffers the drain voltage of the power MOSFET 120. This voltage is then compared to the reference voltage Vref2: If the drain is shorted the source, the input to the comparator Comp2 will be pulled low. The output of the comparator Comp2 will switch the logic circuit that will turn off the gate drive circuit 110 and the power to the inductor.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A circuit for performing an unclamped inductive test on a metal oxide semiconductor field effect transistor (MOSFET) device driven by a gate driver comprising:

a current sense circuit for measuring an unclamped inductive testing (UIS) current that increases with an increase of a pulse width inputted from said gate driver to said MOSFET device wherein said current sensing circuit further includes switches and a timing and a make before break (MBB) control circuit for switching and turning off said gate driver when a predefined UIS current is reached.

2. A method for performing an unclamped inductive test on a metal oxide semiconductor field effect transistor (MOSFET) device driven by a gate driver comprising:

measuring an unclamped inductive testing (UIS) current by using a current sense circuit while increasing said UIS current by continuously applying a gate driving pulse from said gate driver to said MOSFET device; and applying a timing and make before break (MBB) control circuit for controlling switches for turning off said gate driver when a predefined UIS current is measured by said current sensing circuit.

\* \* \* \* \*